(12) United States Patent
Horiuchi

(10) Patent No.: US 10,580,711 B2
(45) Date of Patent: Mar. 3, 2020

(54) ELECTRONIC DEVICE MOUNTING BOARD AND ELECTRONIC PACKAGE

(71) Applicant: KYOCERA Corporation, Kyoto-shi, Kyoto (JP)

(72) Inventor: Kanae Horiuchi, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/303,047

(22) PCT Filed: May 17, 2017

(86) PCT No.: PCT/JP2017/018554
§ 371 (c)(1),
(2) Date: Nov. 19, 2018

(87) PCT Pub. No.: WO2017/200011
PCT Pub. Date: Nov. 23, 2017

(65) Prior Publication Data
US 2019/0295910 A1    Sep. 26, 2019

(30) Foreign Application Priority Data

May 20, 2016 (JP) .................................. 2016-101295

(51) Int. Cl.
| | | |
|---|---|---|
| *H01L 23/12* | (2006.01) | |
| *H01L 23/02* | (2006.01) | |
| *H01L 23/34* | (2006.01) | |
| *H01L 27/146* | (2006.01) | |
| *H01L 31/024* | (2014.01) | |
| *H01L 33/64* | (2010.01) | |
| *H01L 23/15* | (2006.01) | |

(52) U.S. Cl.
CPC .............. *H01L 23/12* (2013.01); *H01L 23/02* (2013.01); *H01L 23/15* (2013.01); *H01L 23/34* (2013.01); *H01L 27/146* (2013.01); *H01L 27/14618* (2013.01); *H01L 27/14634* (2013.01); *H01L 31/024* (2013.01); *H01L 33/64* (2013.01); *H01L 2224/49175* (2013.01); *H01L 2924/16195* (2013.01)

(58) Field of Classification Search
CPC .................... H01L 23/02–10; H01L 23/12–15
See application file for complete search history.

(56) References Cited

FOREIGN PATENT DOCUMENTS

| JP | 05-326772 A | | 12/1993 |
|---|---|---|---|
| JP | 2000-302976 A | | 10/2000 |
| JP | 2000302976 A | * | 10/2000 |
| JP | 2009-105224 A | | 5/2009 |
| JP | 2012-049224 A | | 3/2012 |
| JP | 2012049224 A | * | 3/2012 |
| JP | 2012-156345 A | | 8/2012 |
| WO | 2015/163095 A1 | | 10/2015 |

* cited by examiner

*Primary Examiner* — Daniel P Shook
(74) *Attorney, Agent, or Firm* — Volpe and Koenig, P.C.

(57) ABSTRACT

An electronic device mounting board includes an inorganic substrate, a frame, and a bond. The inorganic substrate includes, on an upper surface, a mount area on which an electronic device is mountable, and a surrounding area surrounding the mount area. The frame is located in the surrounding area of the inorganic substrate to surround the mount area. The bond is located in the surrounding area between the inorganic substrate and the frame. The bond has a plurality of cavities.

8 Claims, 9 Drawing Sheets

ELECTRONIC DEVICE MOUNTING BOARD AND ELECTRONIC PACKAGE

FIELD

The present invention relates to a frame and an electronic package on which an electronic device, such as an imaging device including a charge-coupled device (CCD) or a complementary metal oxide semiconductor (CMOS) device, a light-emitting device including a light emitting diode (LED), or an integrated circuit is mounted.

BACKGROUND

A known electronic device mounting board includes an inorganic substrate and a frame having an opening. The inorganic substrate and the frame are typically joined with a bond. A known electronic package includes such an electronic device mounting board, on which an electronic device is mounted and having a lid covering the upper surface of the frame to close the opening (refer to Japanese Unexamined Patent Application Publication No. 5-326772).

Recent electronic devices with more sophisticated functions tend to generate more heat during operation. With the technique described in Unexamined Patent Application Publication No. 5-326772, heat generated from an electronic device is mostly transferred to an inorganic substrate. The heat transferred to the inorganic substrate may be further transferred to the frame through the bond. The heat transferred to the frame can change the temperature of the conductors inside and outside the frame, and change the resistance of the conductors.

BRIEF SUMMARY

An electronic device mounting board according to one aspect of the present invention includes an inorganic substrate, a frame, and a bond. The inorganic substrate includes, on an upper surface, a mount area on which an electronic device is mountable, and a surrounding area surrounding the mount area. The frame is located in the surrounding area of the inorganic substrate to surround the mount area. The bond is located in the surrounding area between the inorganic substrate and the frame. The bond has a plurality of cavities.

An electronic package according to one aspect of the present invention includes the electronic device mounting board described above, an electronic device, and a lid. The electronic device is mounted on the mount area of the inorganic substrate of the electronic device mounting board. The lid is located at an upper end of the frame of the electronic device mounting board to cover an area surrounded by the frame.

DETAILED DESCRIPTION

Figure 1A:
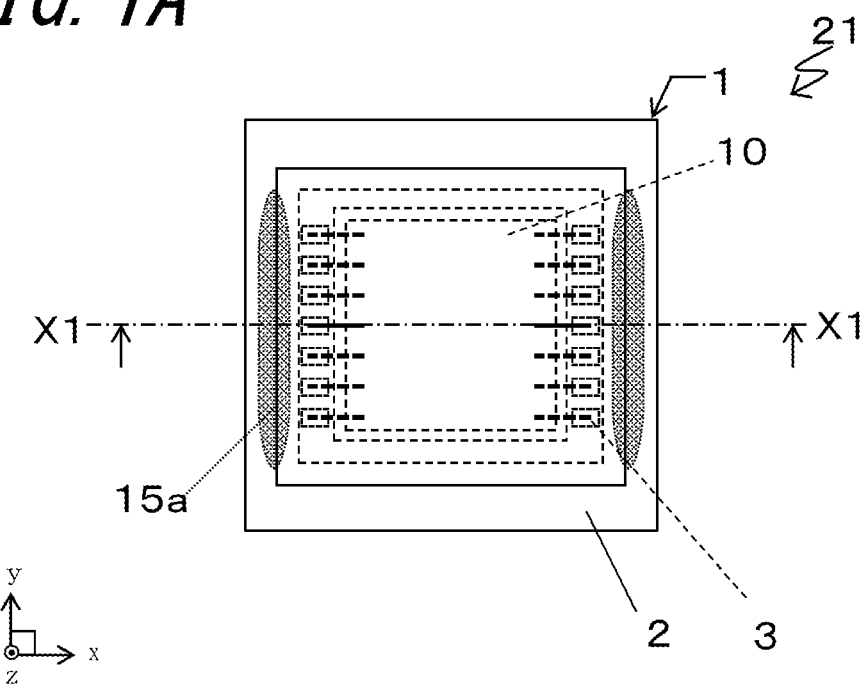
FIG. 1A is an external top view of an electronic device mounting board and an electronic package according to an embodiment of the present invention.

Structures of Electronic Device Mounting Board and Electronic Package

Embodiments of the present invention will now be described by way of example with reference to the drawings. In the embodiments described below, an electronic package includes an electronic device mounted on an electronic device mounting board with a lid bonded to the upper surface of the electronic device mounting board. An electronic module includes a housing covering the outer surface of the electronic device mounting board. Although the electronic device mounting board, the electronic package, and the electronic module may have any of their faces being upward or downward, they are herein defined using the orthogonal xyz coordinate system with the positive z-direction being upward for ease of explanation.

First Embodiment

An electronic package 21 and an electronic device mounting board 1 according to an embodiment of the present invention will now be described with reference to FIGS. 1A to 2C. A bond 15 for bonding a frame 2 and an inorganic substrate 4 together has a plurality of cavities 15a drawn with dots and dotted lines in a top view, and with dots and solid lines in cross-sectional views. The electronic package 21 according to the present embodiment includes the electronic device mounting board 1 and an electronic device 10.

The electronic device mounting board 1 includes the inorganic substrate 4. The inorganic substrate 4 includes, on its upper surface, a mount area 4b on which the electronic device 10 is mountable and a surrounding area 4a surrounding the mount area 4b, the frame 2 in the surrounding area 4a of the inorganic substrate 4 to surround the mount area 4b, and a bond 15 located between the inorganic substrate 4 and the frame 2 in the surrounding area 4a. The bond 15 has the cavities 15a. The electronic device mounting board 1 includes the inorganic substrate 4, which includes, on its upper surface, the mount area 4b on which the electronic device 10 is mountable, and the surrounding area 4a surrounding the mount area 4b. The mount area 4b is on the inorganic substrate 4 and is defined by the surrounding area 4a. The mount area 4b may be located around the center of the inorganic substrate 4 or may be decentered from the center of the inorganic substrate 4. The surrounding area 4a is an area on the inorganic substrate 4 surrounding the mount area 4b and extending along the outer periphery of the inorganic substrate 4.

The inorganic substrate 4 may be formed from, for example, a material having high thermal conductivity. The material having high thermal conductivity can dissipate, across the entire inorganic substrate 4, heat generated during use of the electronic device 10 or heat applied for bonding the frame 2 and the inorganic substrate 4 together with the bond 15. The use of this material can evenly cure the bond 15. In addition, this material can dissipate heat generated in the electronic package 21 outside. Examples of the material of the inorganic substrate 4 include sintered aluminum nitride, sintered silicon nitride, and silicon (Si). For the inorganic substrate 4 formed from, for example, sintered aluminum nitride or sintered silicon nitride, the inorganic substrate 4 may be a laminate of multiple insulating layers. The inorganic substrate 4 may be formed by covering the surface of the laminate of insulating layers with a conductive layer. The electronic device 10 is mountable on the mount area 4b on the upper surface of the inorganic substrate 4.

The inorganic substrate 4 may be formed from a metal material. Examples of the metal material include stainless steel (SUS), a Fe—Ni—Co alloy, alloy 42, copper (Cu), and a copper alloy. When, for example, the frame 2 is formed from sintered aluminum oxide with a coefficient of thermal expansion of about $5 \times 10^{-6}/°$ C. to $10 \times 10^{-6}/°$ C., the inorganic substrate 4 may be formed from stainless steel (SUS 410 or SUS 304) with a coefficient of thermal expansion of about $10 \times 10^{-6}/°$ C. to $17 \times 10^{-6}/°$ C. In this case, the frame 2 has a small difference in thermal contraction and expansion from the inorganic substrate 4. This reduces deformation of the mount area 4b. Thus, the electronic device 10, such as an imaging device or a light-receiving device, has the optical axis with less misalignment with the optical axis of another component attached to the housing, such as a lens or an optical fiber, and can thus maintain intended image definition. The inorganic substrate 4 formed from a non-magnetic metal material is not magnetized, and is thus less likely to affect the operation of an external device such as a lens drive.

The inorganic substrate 4 has a side length of, for example, about 0.3 mm to 10 cm, in correspondence with the size of the frame 2. The inorganic substrate 4 has a thickness of, for example, at least 0.05 mm.

The electronic device 10 is, for example, an imaging device such as a charge-coupled device (CCD) or a complementary metal oxide semiconductor (CMOS) device, a light-emitting device including, for example, a light emitting diode (LED), or an integrated circuit. The electronic device 10 may be mounted on the upper surface of the inorganic substrate 4 with an adhesive. The adhesive is, for example, silver epoxy or a thermosetting resin.

The electronic device mounting board 1 includes the frame 2 in the surrounding area 4a of the inorganic substrate 4 to surround the mount area 4b. The frame 2 is formed from an insulating layer. The frame 2 includes pads 3 for connection to an electronic device on the upper surface. The frame 2 may include, on the lower surface, a plurality of electrodes for connection to external circuits or the inorganic substrate 4. Example materials for the insulating layer forming the frame 2 include an electrical insulating ceramic material and resin (plastics).

Examples of the electrical insulating ceramic material used for the insulating layers forming the frame 2 include sintered aluminum oxide, sintered mullite, sintered silicon carbide, sintered aluminum nitride, sintered silicon nitride, and sintered glass ceramic. Examples of the resin used for the insulating layers forming the frame 2 include an epoxy resin, a polyimide resin, an acryl resin, a phenolic resin, and a fluorine-based resin. Examples of the fluorine-based resin include a polyester resin and a polytetrafluoroethylene resin.

Figure 1B:
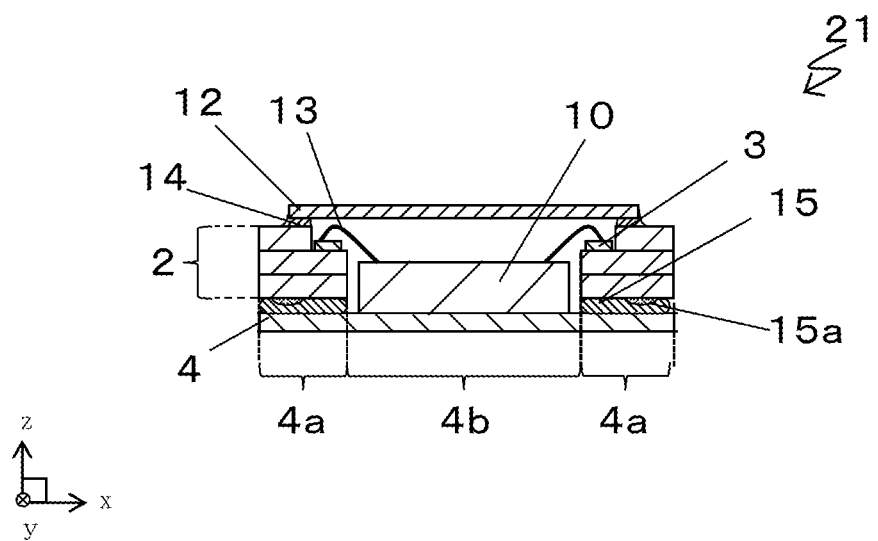
FIG. 1B is a cross-sectional view taken along line X1-X1 in FIG. 1A.

The insulating layers forming the frame 2 may be multiple insulating layers formed from the above material stacked on one another. The frame 2 may include three insulating layers as shown in FIGS. 1A and 1B, or may have one or two insulating layers, or four or more insulating layers. As illustrated in FIGS. 1A and 1B, the insulating layers in the frame 2 may have openings of different sizes in the upper surface to form a step, on which a plurality of pads 3 (described later) may be placed.

The frame 2 has a side length of about 0.3 mm to 10 cm, and may be rectangular or square as viewed from above. The frame 2 has a thickness of, for example, at least 0.2 mm.

The frame 2 may include electrodes for connection to external circuits on any of the upper surface, side surface, or lower surface. The electrodes for connection to external circuits electrically connect the frame 2 to an external circuit board or the electronic package 21 to an external circuit board.

The frame 2 contains inner wires between the insulating layers and feedthrough conductors that vertically connect the inner wires. The inner wires or the feedthrough conductors may be uncovered on the surface of the frame 2. The inner wires or the feedthrough conductors may electrically connect the pads 3 to the electrodes for connection to external circuits.

When the frame 2 is formed from an electrical insulating ceramic material, the pads 3, the electrodes for connection to external circuits, the inner wires, and the feedthrough conductors are formed from tungsten (W), molybdenum (Mo), manganese (Mn), silver (Ag), or copper (Cu), or an alloy containing one or more of these metals. When the frame 2 is formed from a resin, the pads 3, the electrodes for connection to external circuits, the inner wires, and the feedthrough conductors may be formed from copper (Cu), gold, (Au), aluminum (Al), nickel, (Ni), molybdenum (Mo), or titanium (Ti), or an alloy containing one or more of these metals.

The uncovered surfaces of the pads 3, the electrodes for connection to external circuits, the inner wires, and the feedthrough conductors may be plated. The plating layer protects the surfaces of the pads 3, the electrodes for connection to external circuits, the inner wires, and the feedthrough conductors against oxidation. In this structure, the pads 3 and the electronic device 10 can be electrically connected together via a connection member 13 for, for example, wire bonding. The plating layer may be, for example, a Ni plating layer with a thickness of 0.5 to 10 μm. The Ni plating layer may further be coated with a gold (Au) plating layer with a thickness of 0.5 to 3 μm.

The frame 2 may also include a lid 12 for sealing. The lid 12 has, for example, a flat plate shape. The lid 12 is formed from, for example, a highly transparent material such as a glass material for, for example, an imaging device used as the electronic device 10, such as a CMOS or CCD, or a light-emitting device, such as an LED. The lid 12 may be formed from, for example, a metal material or organic material for an integrated circuit used as the electronic device 10. The lid 12 is bonded to the upper surface of the frame 2 with an adhesive member 14 formed from, for example, a thermosetting resin and a brazing material formed from glass with a low melting point or a metal component.

The electronic device mounting board 1 includes the bond 15 located on the surrounding area 4a between the inorganic substrate 4 and the frame 2.

Examples of the bond 15 include a thermosetting resin and a brazing material. Examples of a thermosetting resin used as the material of the bond 15 include a bisphenol A liquid epoxy resin. Examples of a brazing material used as the material of the bond 15 include solder, lead, and glass.

The bond 15 may be conductive. Examples of the conductive bond 15 include silver epoxy, solder, an anisotropic conductive film (ACF), and an anisotropic conductive resin (an anisotropic conductive paste or ACP). The conductive bond 15 can electrically connect the frame 2 to the inorganic substrate 4. When, for example, the frame 2 and the inorganic substrate 4 are electrically connected at the same potential as the ground electrode, the inorganic substrate 4 can shield the electronic device 10 from external noise.

The bond 15 used in the electronic device mounting board 1 has the cavities 15a. With increasingly sophisticated recent functions, the electronic device 10 typically generates more heat during operation. Heat generated by the electronic device 10 is transferred to the inorganic substrate 4. The heat transferred to and accumulated in the inorganic substrate 4 may be further transferred to the frame 2 through the bond 15. The heat transferred to the frame 2 may change the temperature of the conductors inside and outside the frame 2, and may change the resistance of the conductors. In response to an increase in the resistance of the conductors, the signal voltage transferred to the electronic device 10 or the signal voltage transferred from the electronic device 10 may suddenly drop unintendedly (IR drop), and the electronic package 21 may malfunction. In particular, the electronic device 10 with more sophisticated functions has more heat generation and includes thinner conductors installed in the frame 2. This structure may more frequently cause malfunctions of the electronic package 21.

In the electronic device mounting board 1 and the electronic package 21 according to an embodiment of the present invention, the bond 15 between the frame 2 and the inorganic substrate 4 has the cavities 15a. Thus, the bond 15 can reduce heat transferred to the frame 2 through the bond 15 after heat generated during the operation of the electronic device 10 is transferred to the inorganic substrate 4. This structure reduces heat transferred from the inorganic substrate 4 to the frame 2 and the electronic device 10 through the bond 15, and can reduce changes in the temperature of internal or external conductors, and thus accordingly reduce changes in the resistance of the conductors. This structure thus reduces the decrease in the signal voltage (IR drop) caused by changes in the resistance of the conductor, and reduces malfunctions of the electronic package 21. In other words, the electronic device mounting board 1 and the electronic package 21 include the frame 2 with intended electrical properties.

As in the example shown in FIGS. 1A and 1B, the outer periphery of the inorganic substrate 4 may be aligned with or located inward from the outer periphery of the frame 2. The inorganic substrate 4 with the outer periphery aligned with or inward from the outer periphery of the frame 2 can further downsize the electronic package 21.

FIGS. 1B, 2A, 2B, and 2C are cross-sectional views of the electronic device mounting board 1 according to an embodiment of the present invention. In the example shown in FIG. 1B, the cavities 15a in the bond 15 face the frame 2. The cavities 15a can reduce the amount of heat transferred from the inorganic substrate 4 to the frame 2. The cavities 15a facing the frame 2 can reduce the area of contact between the frame 2 and the bond 15. Although the temperature of the bond 15 rises with heat transferred from the inorganic substrate 4, this structure including a smaller area of contact between the frame 2 and the bond 15 can further reduce changes in the temperature of the conductors in the frame 2 caused by heat transferred from the bond 15.

Figure 2A:
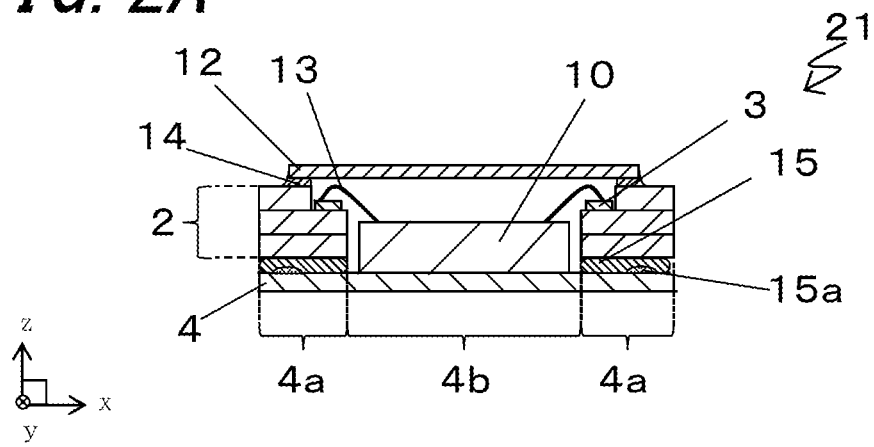
FIGS. 2A, 2B, and 2C are cross-sectional views of an electronic module according to a modification of the embodiment of the present invention.

In the example shown in FIG. 2A, the cavities 15a in the bond 15 face the inorganic substrate 4. The cavities 15a can reduce the amount of heat transferred from the inorganic substrate 4 to the frame 2. The cavities 15a facing the inorganic substrate 4 can reduce the area of contact between the inorganic substrate 4 and the bond 15. This reduces the amount of heat transferred from the inorganic substrate 4 to the bond 15, and to the frame 2 through the bond 15, and further reduces changes in the temperature of the conductors in the frame 2.

To electrically connect the frame 2 and the inorganic substrate 4 to the bond 15, the frame 2 may typically include an electrode for electrical connection on the lower surface. The cavities 15a in the bond 15 facing the inorganic substrate 4 can thus reduce the heat transfer without reducing the area of bonding between the bond 15 and the frame 2. This structure produces the advantageous effects of the present disclosure without raising the resistance between the frame 2 and the inorganic substrate 4.

Figure 2B:
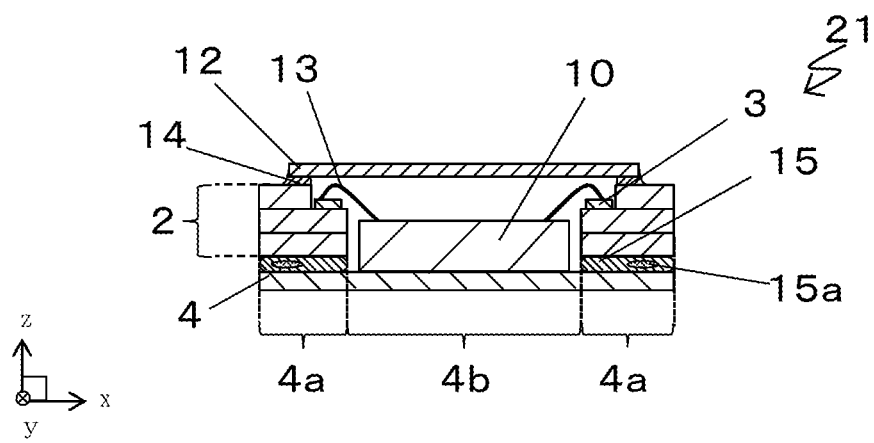

In the example shown in FIG. 2B, the cavities 15a in the bond 15 are located in the middle in the thickness direction of the bond 15. Typically, the electronic device mounting board 1 tends to have a small bonding area for size reduction. As shown in the example of FIG. 2B, the cavities 15a are located in the middle portion of the bond 15 as viewed in the cross section. This structure produces the advantageous effects of the present disclosure without changing the area of bonding between the frame 2 and the bond 15 and the area of bonding between the bond 15 and the inorganic substrate 4.

Figure 2C:
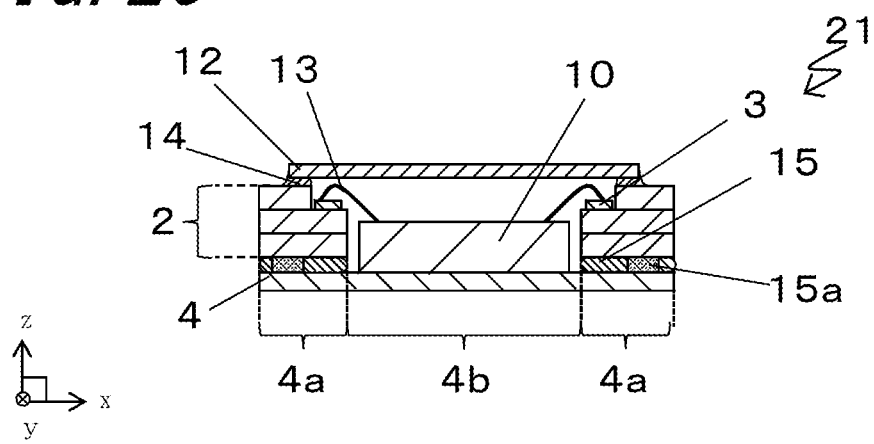

In the example shown in FIG. 2C, the cavities 15a extend through the bond 15 between the frame 2 and the inorganic substrate 4. This structure partially eliminates a contact area between the frame 2 and the inorganic substrate 4 through the bond 15. This structure can thus further reduce the amount of heat transferred from the inorganic substrate 4 to the frame 2 after the heat is generated during the operation of the electronic device 10.

The cavities 15a as shown in FIGS. 1B, 2A, 2B, and 2C may be combined as appropriate. For example, the cavities 15a in the bond 15 shown in FIGS. 1B and 2A may extend upward and downward to face both the frame 2 and the inorganic substrate 4. This structure can further reduce heat transferred from the inorganic substrate 4 to the frame 2 through the bond 15. In some embodiments, the cavities 15a illustrated in FIGS. 1B and 2B may be combined, or the cavities 15a illustrated in FIGS. 2A and 2B may be combined. This structure produces the advantageous effects of the present disclosure without excessively reducing the bonding area.

The cavities 15a illustrated in FIGS. 1A, 1B, 2A, 2B, and 2C may be filled with air or another gas having lower thermal conductivity. The gas herein has a lower thermal conductivity than the bond 15. This structure can further reduce the amount of heat transferred from the inorganic substrate 4 to the frame 2.

In some embodiments, the cavities 15a may be filled with a material having a lower thermal conductivity than the bond 15. This structure can further reduce the amount of heat transferred from the inorganic substrate 4 to the frame 2.

The cavities 15a illustrated in FIGS. 1A and 1B are oval as viewed from above, but may be circular or may have an indefinite form. The cavities 15a having corners with an arc shape or obtuse angle as viewed from above can prevent stress concentration on the corners when expanding with heat transferred to the cavities 15a from the inorganic substrate 4, and thus prevent cracks or other defects in the bond 15.

The cavities 15a illustrated in FIGS. 1A, 1B, 2A, 2B, and 2C have an arc profile as viewed in cross section. The cavities 15a having no corners as viewed in cross section can prevent stress concentration on corners when expanding with heat transferred to the cavities 15a from the inorganic substrate 4, and thus prevent cracks or other defects in the bond 15. In the examples in FIGS. 1A and 1B, one cavity 15a is located on each of the opposing two sides. In some embodiments, a plurality of cavities may be located on each of the two sides.

The bond 15 may have a plurality of cavities 15a located in a well-balanced manner. For example, the plurality of cavities 15a located in a well-balanced manner herein refer to being the cavities at regular intervals or with equivalent total areas. The regular intervals or the equivalent total areas include a tolerance of, for example, about 30 to 50%. In some embodiments, the cavities 15a may be spaced unevenly, or placed densely in one part or arranged in a staggered manner. The cavities 15a spaced unevenly may have more cavities 15a placed in a part with many wires, or may be arranged in conformance with the warping profile of the frame 2, to enhance the advantageous effects.

The cavities 15a having, for example, the longest diagonal line of at least 0.05 mm as viewed from above reliably provide heat insulation. The cavities 15a may have a thickness of, for example, at least 0.5% of the thickness of the bond 15.

Structure of Electronic Module

Figure 3A:
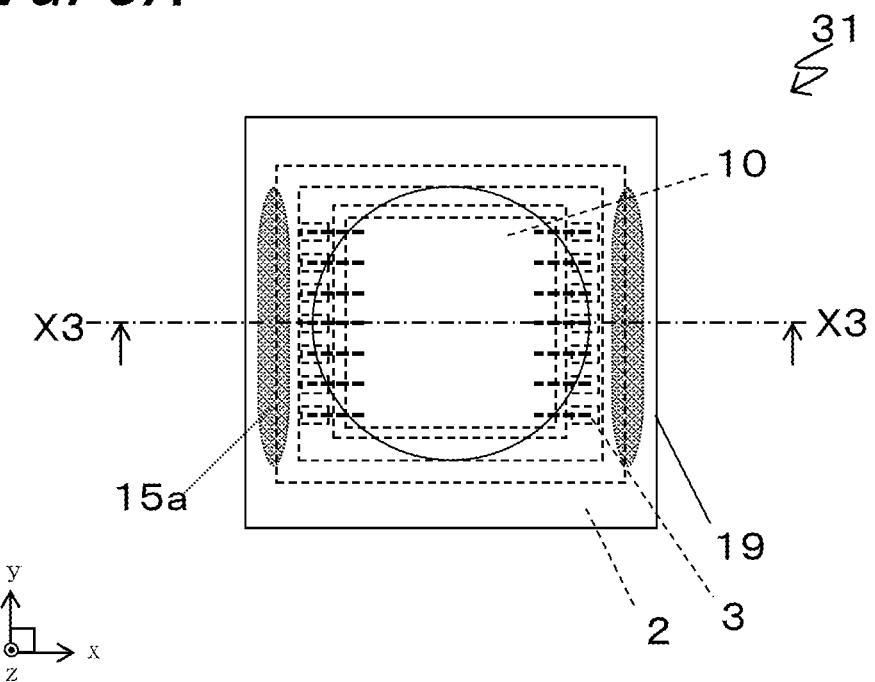
FIG. 3A is an external top view of an electronic device mounting board and an electronic package according to a modification of the embodiment of the present invention.
Figure 3B:
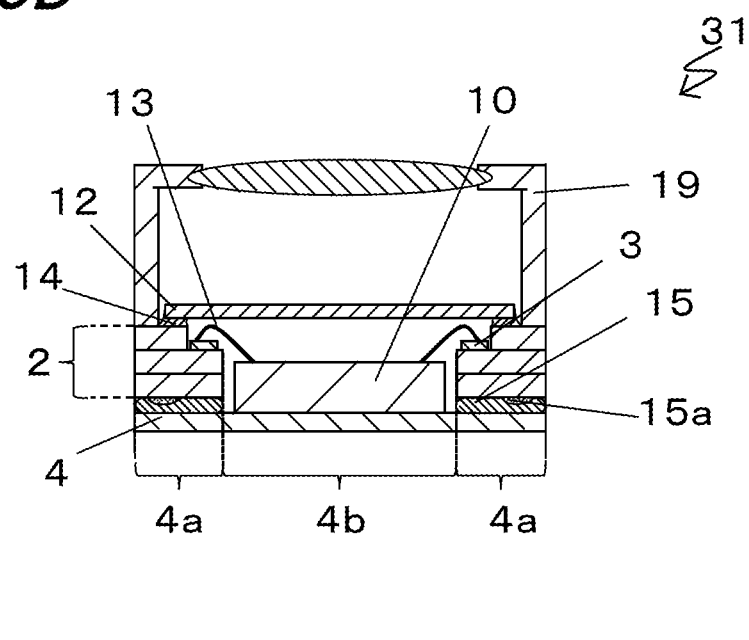
FIG. 3B is a cross-sectional view taken along line X3-X3 in FIG. 3A.

FIGS. 3A and 3B show an electronic module 31 including the electronic device mounting board 1. The electronic module 31 includes the electronic package 21 and a housing 19 on the electronic package 21. The electronic package 21 includes the electronic device mounting board 1 and the electronic device 10 mounted on the mount area 4b of the inorganic substrate 4 of the electronic device mounting board 1. FIGS. 3A and 3B show an imaging module for illustration.

In the example shown in FIGS. 3A and 3B, the electronic module 31 includes the housing 19 (lens holder). The housing 19 improves hermetical sealing and reduces external stress directly applied to the electronic package 21. The housing 19 is formed from, for example, a resin or metal material. The lens holder as the housing 19 may incorporate one or more lenses formed from, for example, a resin, a liquid, glass, or quartz. The housing 19 may include, for example, a drive for vertical or horizontal driving, and may be electrically connected to the frame 2.

The housing 19 may have an opening in at least one of the four sides as viewed from above. Through the opening in the housing 19, an external circuit board may be located for electrical connection to the frame 2. After the external circuit board is electrically connected to the frame 2, the opening in the housing 19 may be sealed with a sealant, such as a resin, to hermetically seal the inside of the electronic module 31.

In the electronic module 31 shown in FIGS. 3A and 3B, the housing 19 and the cavities 15a in the bond 15 overlap in a specific area as viewed from above, but may have no overlapping area. For example, when the housing 19 and the cavities 15a in the bond 15 overlap in a specific area as viewed from above, the cavities 15a absorb pressure applied from the upper surface of the housing 19, and can thus reduce stress on the frame 2 or the inorganic substrate 4. This structure reduces breaks or cracks in the frame 2 or the inorganic substrate 4. When, for example, the housing 19 and the cavities 15a have no overlapping area as viewed from above, the cavities 15a reduce bending of the frame 2 when pressure is applied to the upper surface of the housing 19 to bond the housing 19 and the electronic device mounting board 1 together. This improves the bonding performance. As in the example shown in FIGS. 3A and 3B, the structure including both the overlapping area between the housing 19 and the cavities 15a in the bond 15 and the non-overlapping area between them produces both of the two advantageous effects described above.

Method for Manufacturing Electronic Device Mounting Board and Electronic Package An example method for manufacturing the electronic device mounting board 1 and the electronic package 21 according to the present embodiment will now be described. The manufacturing method described below uses a multi-piece wiring substrate to fabricate the frames 2.

(1) A ceramic green sheet that is to be the frame 2 is prepared first. To obtain the frame 2 formed from, for example, sintered aluminum oxide ($Al_2O_3$), powders, such as silica ($SiO_2$), magnesia (MgO), or calcium oxide (CaO), are added as sintering aids to $Al_2O_3$ powder, and an appropriate binder, an appropriate solvent, and an appropriate plasticizer are added to the powder mixture, which is then kneaded to form slurry. The slurry is then shaped into a sheet using a doctor blade or by calendaring to obtain a ceramic green sheet for a multi-piece substrate.

The frame 2 formed from, for example, a resin may be molded using a mold having a predetermined shape by transfer molding or injection molding. The frame 2 may be formed from a glass epoxy resin, which is a base glass fiber impregnated with a resin. In this case, the base glass fiber is impregnated with a precursor of an epoxy resin. The epoxy resin precursor is then cured by heat at a predetermined temperature to form the frame 2.

(2) A metal paste is then applied or placed, by screen printing or other techniques, into the areas to be the pads 3, the electrodes for connection to external circuits, the inner wires, and the feedthrough conductors in the ceramic green sheet obtained through the above process (1). The metal paste is prepared by adding an appropriate solvent and an appropriate binder to metal powder containing the above metal materials and then kneading the mixture to have an appropriate viscosity. The metal paste may contain glass or ceramic to increase the strength of bonding with the frame 2.

(3) The green sheet is then processed using, for example, a mold. This process includes forming an opening in the center of the green sheet to be the frame 2.

(4) Multiple ceramic green sheets to be the insulating layers are then stacked and pressed to prepare a ceramic green sheet laminate to be the frame 2.

(5) This ceramic green sheet laminate is then fired at about 1,500 to 1,800° C. to obtain a multi-piece wiring substrate including an array of frames 2. In this process, the metal paste described above is fired together with the ceramic green sheet to be the frame 2 to form the pads 3, the electrodes for connection to external circuits, the inner wires, and the feedthrough conductors.

(6) The multi-piece wiring substrate resulting from the firing process is then cut into a plurality of frames 2. In this cutting process, separation grooves may be formed along the outer edge of each of the frames 2, and the multi-piece wiring substrate may be split along the separation grooves into the plurality of frames 2 or cut along the outer edge of each of the frames 2 by, for example, slicing. The separation grooves may be formed to have a depth smaller than the thickness of the multi-piece wiring substrate using a slicer after the firing process. In still other embodiments, the separation grooves may be formed by pressing a cutter blade onto the ceramic green sheet laminate that is to be the multi-piece wiring substrate or by forming cuts into the ceramic green sheet laminate to a depth smaller than its thickness with a slicer.

(7) The inorganic substrate 4 to be bonded to the lower surface of the frame 2 is then prepared. The inorganic substrate 4 formed from a metal material is formed by, for example, punching a metal plate with a known stamping mold or by etching the plate. The inorganic substrate 4 formed from another material can be formed by other processing appropriate for the material, such as punching. The inorganic substrate 4 formed from a metal material such as a Fe—Ni—Co alloy, alloy 42, Cu, or a copper alloy may have surface plating with a Ni plating layer and a gold plating layer. The plating layers effectively protect the surface of the inorganic substrate 4 against oxidation.

The inorganic substrate 4 formed from, for example, an electrical insulating ceramic material can be manufactured with the processes (1) to (6). The conditions such as the firing temperature or printing method are appropriately changed depending on the types of electrical insulating ceramic material used for the inorganic substrate 4. The inorganic substrate 4 having a conductor pattern printed on the surface may similarly have the printed surface plated with a Ni plating layer and a gold plating layer. The plating layers effectively protect the surface of the inorganic substrate 4 against oxidation. The inorganic substrate 4 may have a convex upward at a predetermined position by pressing or using a mold.

(8) Subsequently, the frame 2 and the inorganic substrate 4 are bonded together with the bond 15. The bond 15, as a thermosetting resin (adhesive member) paste, is applied by screen printing or dispensing to the bonding surface of either the frame 2 or the inorganic substrate 4 or both the frame 2 and the inorganic substrate 4. After the thermosetting resin is dried, the frame 2 and the inorganic substrate 4, stacked one on the other, are placed into, for example, an atmosphere furnace or oven with a tunnel structure to be pressed and heated to thermally set the bond. This firmly bonds the frame 2 and the inorganic substrate 4 together.

The cavities 15a are formed in this process. Examples of the method for forming the cavities 15a include forming a plate that prevents the bond 15 from being applied to portions to be the cavities 15a during screen printing. In some embodiments, a screen including mesh threads with a large diameter may be forming the cavities 15a in portions that come into contact with the mesh threads. In some embodiments, the bond 15 may be applied twice in the screen printing process to form the cavities 15a facing the frame 2 or the inorganic substrate 4. For example, the bond 15 is applied first in portions to be the cavities 15a, and the bond 15 is applied for the second time using a plate that prevents the bond 15 from being applied to the portions to be the cavity 15a. This forms the cavities 15a.

In some embodiments, for example, a larger amount of bond 15 may be intendedly applied around the cavities 15a. The cavities 15a can be formed in the process of bonding the frame 2 and the inorganic substrate 4 together by pressing.

The bond 15 is formed from a main component such as a bisphenol A liquid epoxy resin, a bisphenol F liquid epoxy resin, or a phenolic novolac liquid resin, to which a filler such as spherical silicon oxide, a hardener containing an acid anhydride as a main component such as tetrahydromethyl-phthalic anhydride, and a coloring agent such as carbon powder are added. The mixture is mixed and kneaded with, for example, a centrifugal mixer into a paste. Other materials for the bond 15 include a material formed by adding a hardener such as an imidazole-based, amine-based, phosphorus-based, hydrazine-based, imidazole adduct-based, amine adduct-based, cationic polymerization-based, or dicyandiamide-based hardener to an epoxy resin such as a bisphenol A epoxy resin, a bisphenol A modified epoxy resin, a bisphenol F epoxy resin, a phenolic novolac epoxy resin, a cresol novolac epoxy resin, a specialty novolac epoxy resin, a phenol derivative epoxy resin, or a bisphenol skeleton epoxy resin.

(9) The electronic device 10 is then mounted on the mount area 4b of the inorganic substrate 4. The electronic device 10 is electrically connected to the frame 2 by, for example, wire bonding. The electronic device 10 may be fixed onto the inorganic substrate 4 with an adhesive or another bond applied to the electronic device 10 or to the inorganic substrate 4. After the electronic device 10 is mounted on the mount area 4b of the inorganic substrate 4, the lid 12 may be bonded to the frame 2 with the adhesive member 14.

The electronic package 21 is obtained by assembling the frame 2 and the inorganic substrate 4 through the processes (1) to (9). The processes (1) to (9) may be performed in any order.

Second Embodiment

Figure 4A:
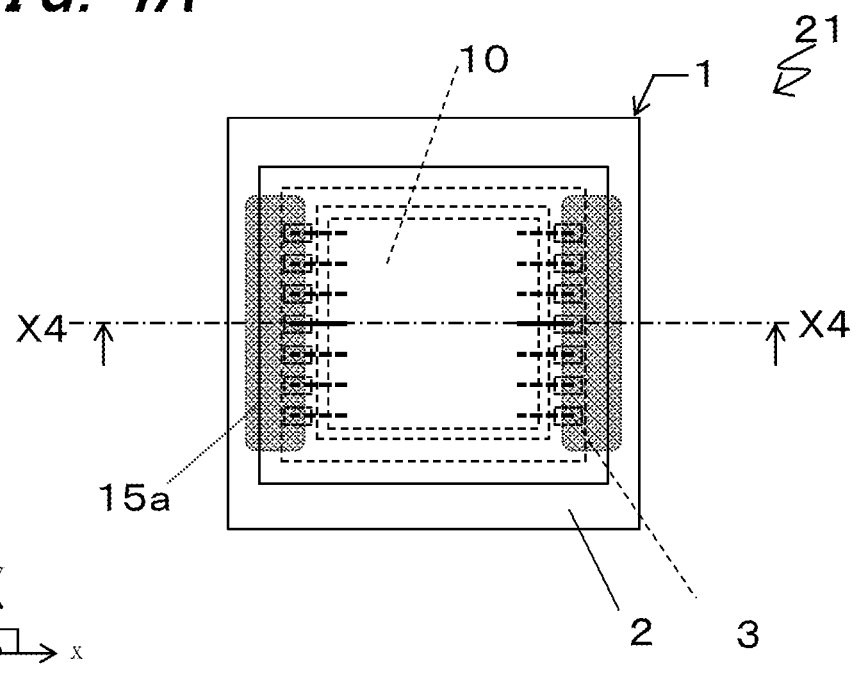
FIG. 4A is an external top view of an electronic device mounting board and an electronic package according to another embodiment of the present invention.
Figure 4B:
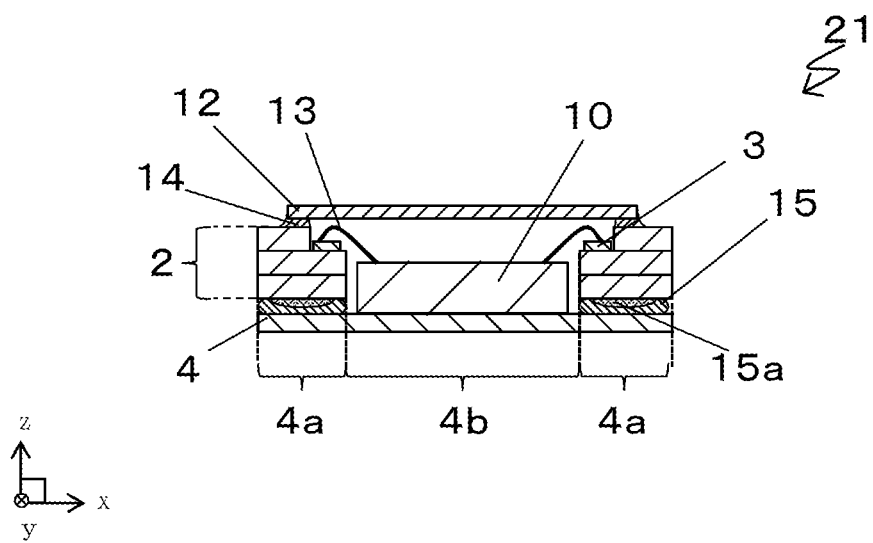
FIG. 4B is a cross-sectional view taken along line X4-X4 in FIG. 4A.

An electronic device mounting board 1 and an electronic package 21 according to another embodiment (second embodiment) of the present invention will now be described with reference to FIGS. 4A and 4B. The electronic device mounting board 1 and the electronic package 21 according to the present embodiment differ from the electronic device mounting board 1 and the electronic package 21 according to the first embodiment in that the cavities 15a partially overlap the pads 3 on the upper surface of the frame 2 as viewed from above.

In the present embodiment, the electronic device mounting board 1 includes the pads 3 on the upper surface of the frame 2, and the cavities 15a in the bond 15 partially overlapping the pads 3 as viewed from above. Typically, a large number of main wires are located around the pads 3 electrically connected to the electronic device 10. The pads 3 may typically have a low resistance to transfer the signal voltage from the electronic device 10 to the electronic device mounting board 1. As in the present embodiment, the structure including the areas of overlap between the cavities 15a in the bond 15 and the pads 3 as viewed from above can reduce heat intensively transferred to the pads 3 and the surroundings from the inorganic substrate 4 through the bond 15. This structure can thus further reduce changes in the resistance caused by wire temperatures in or around the pads 3, and reduce the decrease in the signal voltage (IR drop) from the electronic device 10.

The area of overlap between the cavities 15a in the bond 15 and the pads 3 on the upper surface of the frame 2 may be at least half the area of the pads 3. This structure can further reduce changes in the resistance caused by wire temperatures in or around the pads 3, reduce the decrease in the signal voltage (IR drop) from the electronic device 10, and thus reduce malfunctions of the electronic package 21.

The area of overlap between the cavities 15a in the bond 15 and the pads 3 on the upper surface of the frame 2 may be smaller than or equal to half the area of the pads 3. The cavities 15a can prevent the frame 2 with a smaller thickness from deforming (being warped) under pressure applied during wire-bonding and from causing a bonding failure to maintain the advantageous effects of the present disclosure. The cavities 15a in the bond 15 each having an inner end located outward from the wire-bonded portion as viewed from above further reduce deformation of the frame 2.

Third Embodiment

An electronic device mounting board 1 and an electronic package 21 according to another embodiment (third embodiment) of the present invention will now be described with reference to FIGS. 5A and 5B. The electronic device mounting board 1 and the electronic package 21 according to the present embodiment differ from the electronic device mounting board 1 and the electronic package 21 according to the first embodiment in that the cavities 15a in the bond 15 are each circular and located on all the sides. The cavities 15a located in a well-balanced manner herein refer to, for example, the cavities 15a at regular intervals. The regular intervals herein include a tolerance of, for example, 30 to 50%.

In the present embodiment, the cavities 15a in the bond 15 are substantially circular as viewed from above. This structure reduces heat transferred from the inorganic substrate 4 to the frame 2 through the bond 15, and reduces cracks or other defects in the bond 15 by reducing stress concentration when heat transferred from the inorganic substrate 4 expands the gas filled in the cavities 15a. This structure thus reduces malfunctions of the electronic package 21 and maintains its airtightness.

In the present embodiment, the frame 2 for the electronic device mounting board 1 is rectangular, and has the cavities 15a on all sides in a well-balanced manner. This structure allows uniform transfer of heat generated in the electronic device 10 and transferred to the inorganic substrate 4 to the frame 2 through the bond 15 while reducing the heat. This reduces temperature changes or allows uniform temperature changes in the conductors inside and outside the frame 2. This structure reduces the decrease and uneven distribution in the signal voltage (IR drop) from the electronic device 10, and thus reduces malfunctions of the electronic package 21. In particular, when the pads 3 are located in four directions, the cavities 15a located on all sides in a well-balanced manner, as in the present invention, allow uniform changes in the temperature of wires located in or around the pads 3 on each side. This structure thus further reduces malfunctions of the electronic package 21.

The cavities 15a located on all sides in a well-balanced manner allows uniform heat transfer from the inorganic substrate 4 to the frame 2 through the bond 15 across the entire frame 2. This structure can thus allow uniform contraction or deformation of the frame 2 or the bond 15 caused by heat, and can reduce cracks and breaks caused by stress concentration. Thus, the electronic package 21 can maintain its airtightness.

Figure 5A:
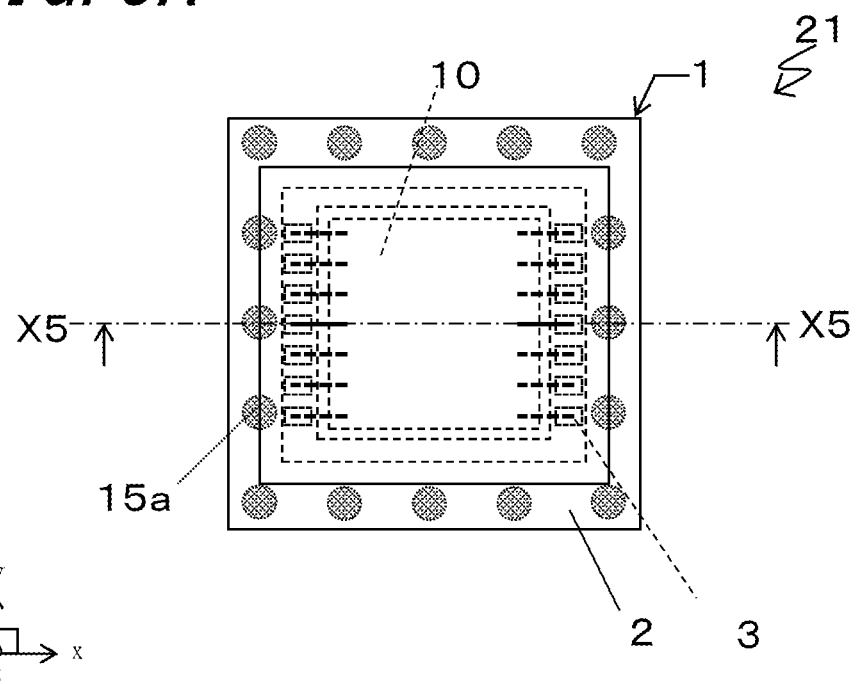
FIG. 5A is an external top view of an electronic device mounting board and an electronic package according to another embodiment of the present invention.
Figure 5B:
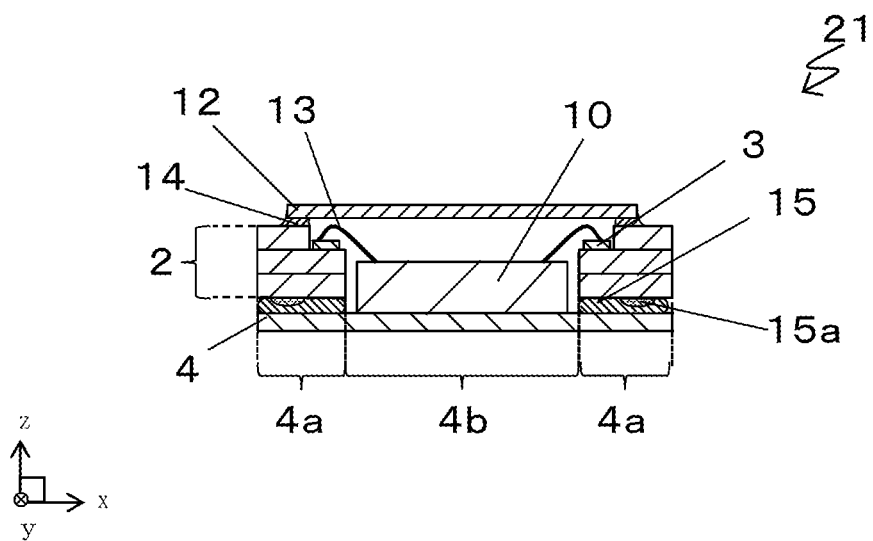
FIG. 5B is a cross-sectional view taken along line X5-X5 in FIG. 5A.

In the embodiment shown in FIGS. 5A and 5B, the cavities 15a are circular as viewed from above, but may be oval or partially bent depending on, for example, tolerance. The cavities 15a may be rectangular or polygonal with more than four sides, and may have rounded corners.

Fourth Embodiment

An electronic device mounting board 1 and an electronic package 21 according to another embodiment (fourth embodiment) of the present invention will now be described with reference to FIGS. 6A to 7B. The electronic device mounting board 1 and the electronic package 21 according to the present embodiment differ from the electronic device mounting board 1 and the electronic package 21 according to the first embodiment in that the mount area 4b of the electronic device mounting board 1 is decentered. The structure illustrated in FIGS. 6A and 6B has a plurality of cavities 15a located substantially in a well-balanced manner. The structure illustrated in FIGS. 7A and 7B additionally includes a large cavity 15a in a wide part of the surrounding area.

When the electronic device mounting board 1 according to the present embodiment is viewed from above, the outer periphery of the frame 2 overlaps the outer periphery of the inorganic substrate 4, and the inner periphery of the frame 2 overlaps the outer periphery of the mount area 4b. The mount area 4b is decentered from the center of the inorganic substrate 4. As viewed from above, more cavities 15a in the bond 15 are located in the wide part of the surrounding area 4a than in a narrow part of the surrounding area 4a. Typically, when the mount area 4b is decentered in the electronic device mounting board 1, a large number of main wires such as a solid pattern of a power source or a ground potential or a signal pattern for outputting signals from the electronic device 10 are located in the area of the frame 2 overlapping the wide part of the surrounding area 4a. Thus, the cavities 15a in the bond 15 located in the wide part of the surrounding area 4a, as in the present embodiment, can reduce heat transferred from the inorganic substrate 4 to these main wires through the bond 15. This structure can thus reduce temperature changes in the conductors in these main wires, and reduce variations in the resistance of the conductors. This structure can thus reduce the decrease in the signal voltage (IR drop) caused by changes in the resistance of the conductors in these main wires.

Figure 6A:
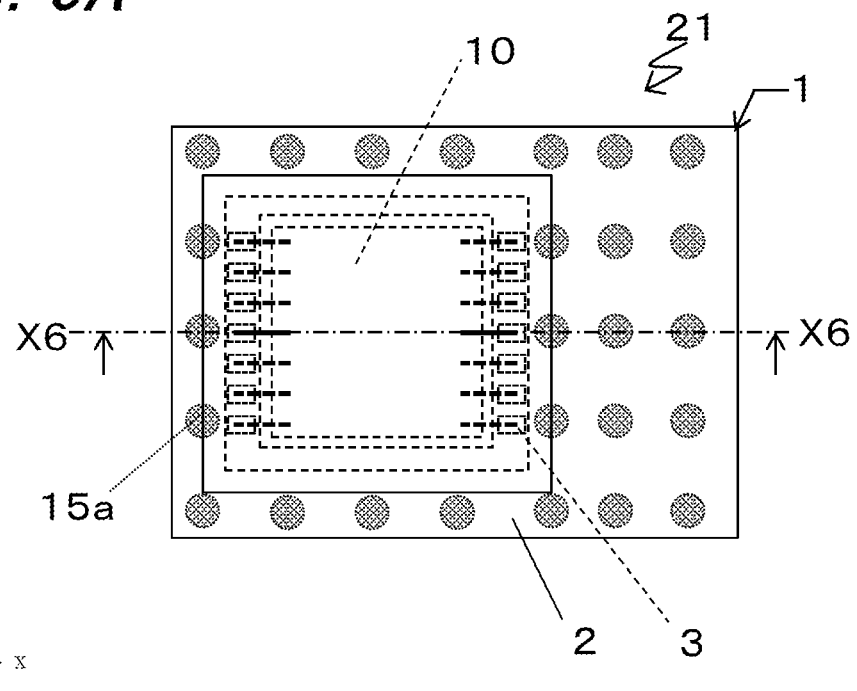
FIG. 6A is an external top view of an electronic device mounting board and an electronic package according to another embodiment of the present invention.
Figure 6B:
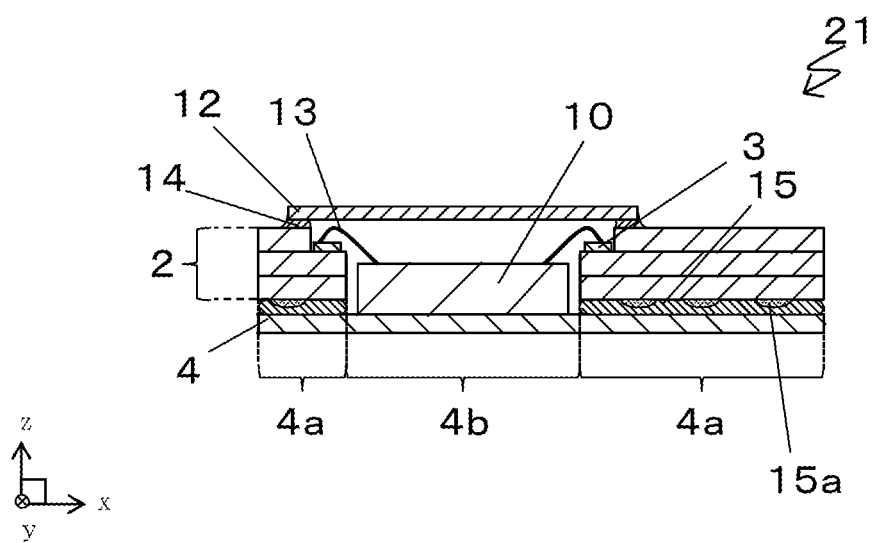
FIG. 6B is a cross-sectional view taken along line X6-X6 in FIG. 6A.

In the present embodiment shown in FIGS. 6A and 6B, the plurality of cavities 15a are located substantially at regular intervals, and more cavities 15a are located in the wide part of the surrounding area 4a than in the narrow part of the surrounding area 4a. As in the third embodiment, this structure allows uniform transfer of heat generated in the electronic device 10 and transferred to the inorganic substrate 4 to each area of the frame 2 through the bond 15 while reducing the heat. This reduces temperature changes or allows uniform temperature changes in the conductors inside and outside the frame 2. The structure reduces the decrease and uneven distribution in the signal voltage (IR drop) from the electronic device 10, and thus reduces malfunctions of the electronic package 21.

The cavities 15a located in the manner shown in FIGS. 6A and 6B allow the bond 15 to function as a wall to extend from the mount area 4b to the surrounding area 4a or between the plurality of cavities 15a. This structure reduces formation of cracks through the surrounding area 4a and the mount area 4b when the bond 15 receives stress or other external force. This structure thus reduces leaks in the electronic package 21. A thinner frame 2 may be less deformed in the area of overlap between the cavities 15a and the frame 2. When the frame 2 and the inorganic substrate 4 are electrically connected together, the contact resistance can be reduced further.

Figure 7A:
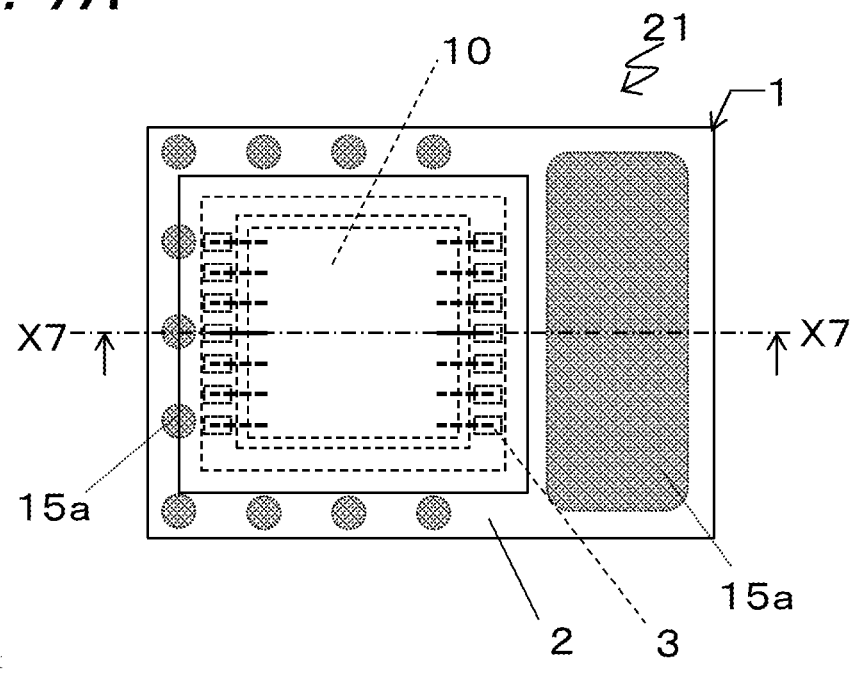
FIG. 7A is an external top view of an electronic device mounting board and an electronic package according to a modification of another embodiment of the present invention.
Figure 7B:
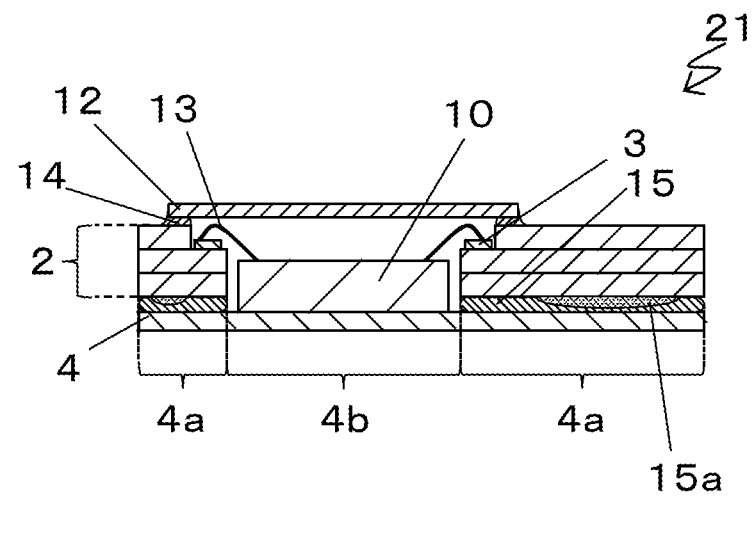
FIG. 7B is a cross-sectional view taken along line X7-X7 in FIG. 7A

In the present embodiment shown in FIGS. 7A and 7B, the cavity 15a in the wide part of the surrounding area 4a has a larger area than those in the narrow area, as viewed from above. Typically, when the mount area 4b of the electronic device mounting board 1 is decentered, as described above, a large main wire, such as a solid pattern of a power source or a ground potential, may be located in a part of the frame 2 overlapping the wide part of the surrounding area 4a as viewed from above. As shown in FIGS. 7A and 7B, the wide part of the surrounding area 4a has the cavity 15a with a larger area than the cavities 15a in the narrow part of the surrounding area 4a. This structure allows a large part of the solid pattern of the power source or the ground potential to overlap the cavity 15a with the larger area.

This structure can thus reduce heat transferred from the inorganic substrate 4 through the bond 15 to the solid pattern of the power source or the ground potential, and thus reduce temperature changes in the conductors in these wires. This structure can reduce changes in the resistance of the conductors, and reduce the decrease in the signal voltage (IR drop) caused by changes in the resistance of the conductors.

The plurality of cavities 15a may be located to achieve a well-balanced weight of the structure of the electronic device mounting board 1 in the lateral or longitudinal direction as viewed from above. This structure allows the electronic package 21 bonded to the external circuit board to be mounted without being inclined due to weight differences.

Fifth Embodiment

Figure 8A:
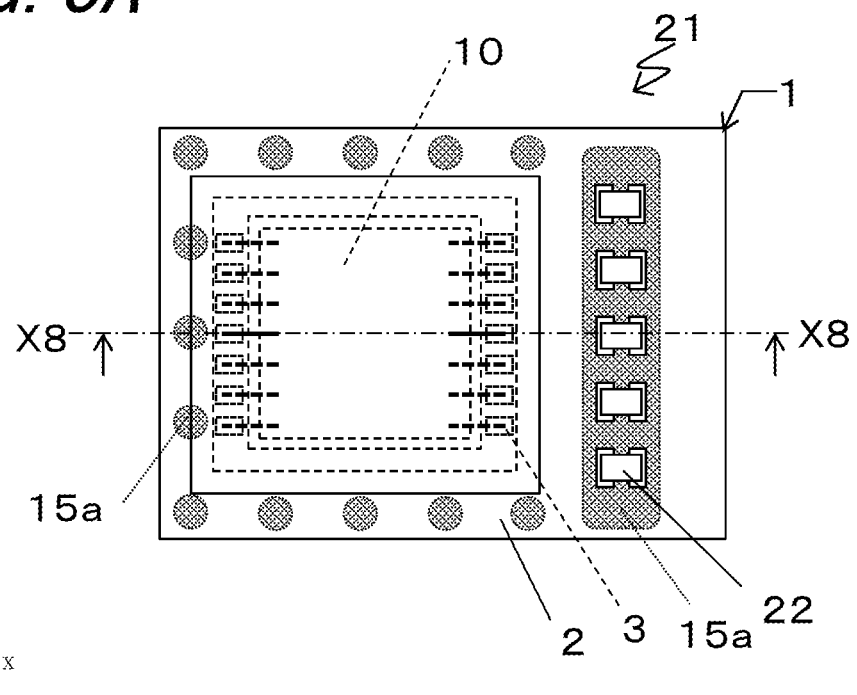
FIG. 8A is an external top view of an electronic device mounting board and an electronic package according to another embodiment of the present invention.
Figure 8B:
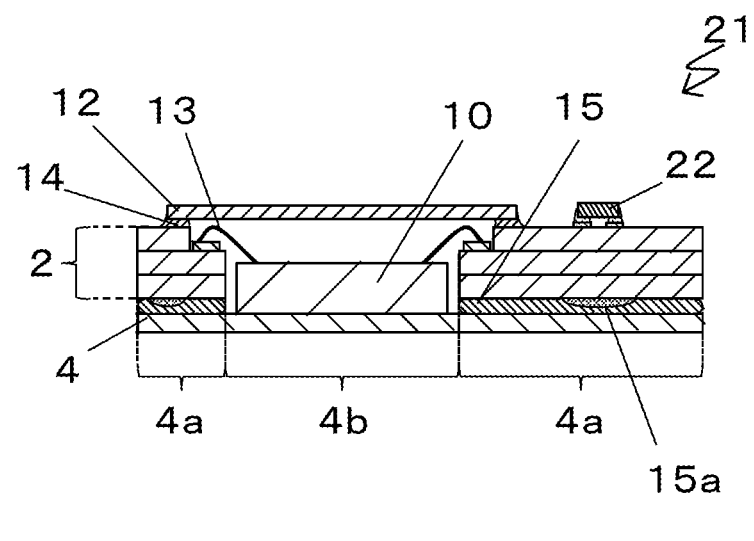
FIG. 8B is a cross-sectional view taken along line X8-X8 in FIG. 8A.

An electronic device mounting board 1 and an electronic package 21 according to another embodiment (fifth embodiment) of the present invention will now be described with reference to FIGS. 8A and 8B. The electronic device mounting board 1 and the electronic package 21 according to the present embodiment differ from the electronic device mounting board 1 and the electronic package 21 according to another embodiment (fourth embodiment) in that the electronic package 21 includes an electronic component 22 on its upper surface, and the cavities 15a in the bond 15 overlaps the electronic component 22 as viewed from above.

In the present embodiment, the electronic package 21 includes electronic components 22 on the upper surface, and the cavities 15a in the bond 15 partially overlapping the electronic component 22 as viewed from above. Typically, when each electronic component 22 is mounted on the electronic package 21, wires for signals, such as wires extending from the electronic device 10 and connecting to the electronic component 22 through the pads 3 or wires extending from the electronic component 22 and connecting to external circuits, may be densely located around the electronic component 22. In contrast, the structure including the area of overlap between the electronic component 22 and the cavities 15a, as in the present embodiment, can reduce heat transferred to these wires for signals from the inorganic substrate 4 through the bond 15.

This structure reduces temperature changes in the conductors in these wires, and reduces changes in the resistance of the conductors, and thus reduces the decrease in the signal voltage (IR drop) caused by changes in the resistance of the conductors.

Typically, the electronic component 22 may have the properties changed by heat. The structure with the electronic component 22 and the cavities 15a partially overlapping as viewed from above can reduce heat transferred to the electronic component 22 from the inorganic substrate 4 through the bond 15. This structure can reduce changes in the properties of the electronic component 22 caused by temperature changes.

The cavities 15a may overlap the electronic component 22 completely or partially as viewed from above. The structure including the electrodes connected to the electronic component 22 and the cavities 15a overlapping across a large area as viewed from above can reduce the decrease in the signal voltage (IR drop) caused by changes in the resistance of the conductors.

Examples of the electronic component 22 herein include a passive component such as a resistor, a capacitor, or a coil, an active component such as a transistor or a diode, and other components such as an integrated circuit (IC) or an optical image stabilizer (OIS). The electronic component 22 is electrically connected to the electronic device 10 or the external circuit through the frame 2 and the conductors inside and outside the frame 2.

Sixth Embodiment

An electronic device mounting board 1 and an electronic package 21 according to another embodiment (sixth embodiment) of the present invention will now be described with reference to FIGS. 9A and 9B. The electronic device mounting board 1 and the electronic package 21 according to the present embodiment differ from the electronic device mounting board 1 and the electronic package 21 according to the first embodiment in that a flexible board 5 is located between the frame 2 and the inorganic substrate 4.

In the present embodiment, the electronic device mounting board 1 further includes a frame-shaped flexible board 5 between the upper surface of the inorganic substrate 4 and the lower surface of the frame 2 to surround the mount area 4b. This structure, which also includes the bond 15 with the cavities 15a, can reduce heat transferred from the inorganic substrate 4 to the frame 2, and thus reduce temperature changes in the conductors in the wires of the frame 2. This structure can reduce changes in the resistance of the conductors, and reduce the decrease in the signal voltage (IR drop) caused by changes in the resistance of the conductors.

Figure 9A:
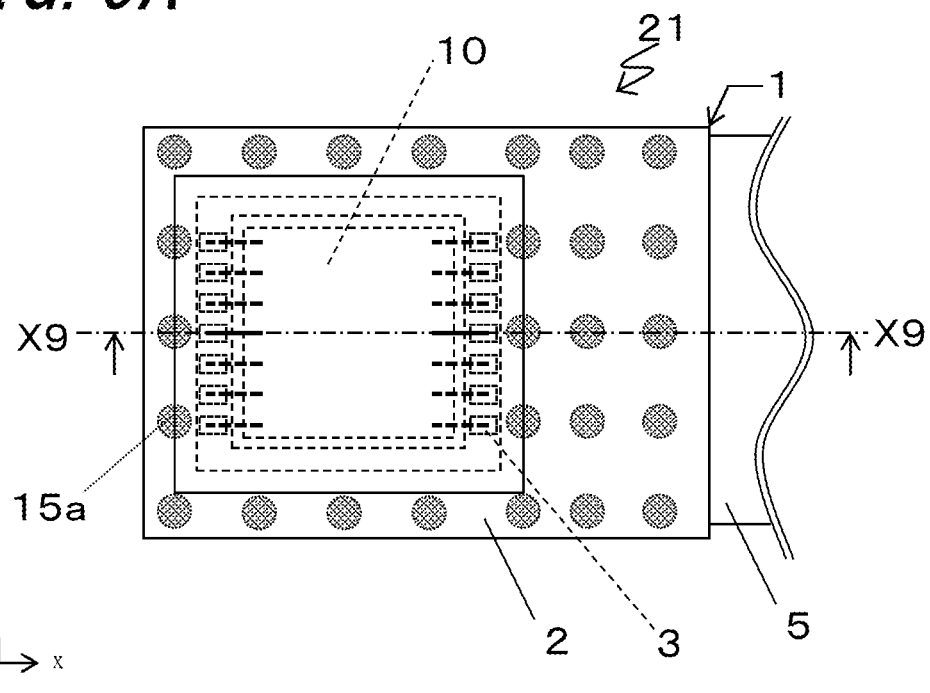
FIG. 9A is an external top view of an electronic device mounting board and an electronic package according to another embodiment of the present invention.
Figure 9B:
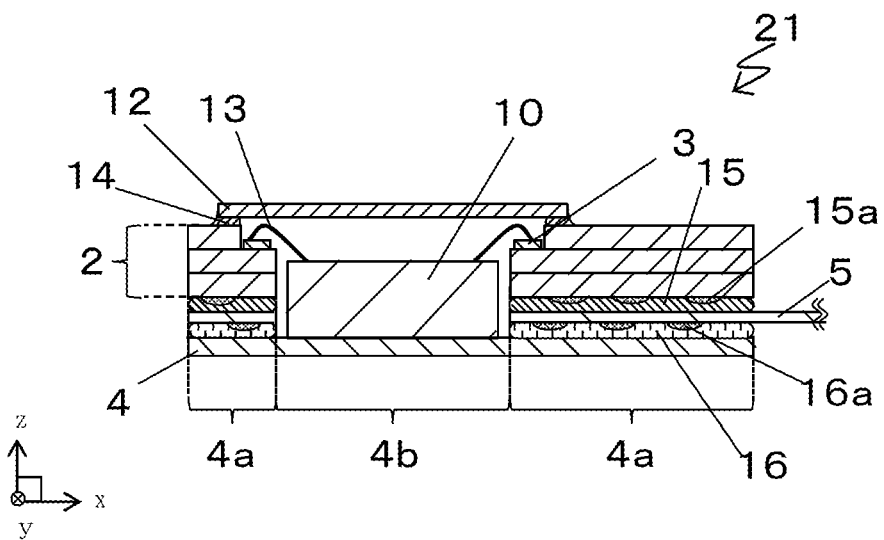
FIG. 9B is a cross-sectional view taken along line X9-X9 in FIG. 9A.

The structure illustrated in FIGS. 9A and 9B includes the bond 15 and the cavities 15a located between the frame 2 and the flexible board 5, and a connector 16 and cavities 16a included in the connector 16 between the flexible board 5 and the inorganic substrate 4. Typically, as in the frame 2, the flexible board 5 also includes internal and external conductors. When receiving heat from the inorganic substrate 4 through the connector 16, these conductors can undergo temperature changes and thus resistance changes. This may cause variations in the signal voltage across the flexible board 5.

The structure illustrated in FIGS. 9A and 9B includes the cavities 16a in the connector 16, which connects the flexible board 5 to the inorganic substrate 4, and the cavities 15a in the bond 15, which connects the flexible board 5 to the frame 2, to reduce heat transferred from the inorganic substrate 4 to the flexible board 5 and the frame 2. This structure reduces temperature changes in the conductors in the wires of the frame 2 and the flexible board 5. This structure can reduce changes in the resistance of the conductors, and reduce the decrease in the signal voltage (IR drop) caused by changes in the resistance of the conductors, and reduce malfunctions of the electronic package 21.

The cavities 15a and 16a may be located at any positions. For example, both cavities 15a and 16a may face the upper surface. In some embodiments, the cavities 15a may face the frame 2, and the cavities 16a may face the inorganic substrate 4 or the flexible board 5. In some embodiments, the cavity 15a may face the flexible board 5, and the cavities 16a may face the inorganic substrate 4 or the flexible board 5.

The cavities 15a and 16a may overlap as viewed from above. When the cavities 15a and 16a overlap as viewed from above, less heat from the inorganic substrate 4 is transferred through the overlapping portion. The cavities 15a and 16a may be located to overlap in a portion with resistance changes least desirable as viewed from above to further enhance heat insulation.

The flexible board 5 may be electrically connected to the frame 2 to serve as an external circuit.

The flexible board 5 may include a base film. Examples of the material for the base film include an insulator formed from a resin, such as a polyimide film. The flexible board 5 includes a conductive layer on the upper surface of the base film. The conductive layer is formed form, for example, copper, aluminum, gold, or nickel, or an alloy containing at least one of these metal materials.

The uncovered surface of the conductive layer may be plated. The plating layer protects the surface of the conductive layer against oxidation. The plating also improves electrical connection between a wiring board 2 and the conductive layer. The plating layer may be, for example, a Ni plating layer with a thickness of 0.5 to 10 μm, and the Ni plating layer may further be coated with a gold (Au) plating layer with a thickness of 0.5 to 3 μm. The plating layer may further be plated with Sn.

The flexible board 5 includes a cover film on the upper surface of the conductive layer. The cover film protects the surface of the conductive layer. The film is formed from a resin material, such as a polyimide film, and has an adhesive applied on one surface. The film is located on the surface of the conductive layer excluding its portions to be electrically connected to the wiring board 2. The flexible board 5 is connected to the wiring board 2 with a conductive bond.

The connector 16 for bonding the flexible board 5 to the inorganic substrate 4 for bonding the flexible board 5 to 2 contain a material difficult to alter under heat applied during mounting of the electronic device 10. Examples of the connector 16 include a bisphenol A liquid epoxy resin and a polyimide resin. Such a bond efficiently reduces separation of the flexible board 5 from the inorganic substrate 4 or 2 during mounting of the electronic device 10. The connector 16 may be conductive to electrically connect the wiring board 2 or the inorganic substrate 4 to the flexible board 5. Examples of the connector 16 include silver epoxy, solder, an ACP, and an ACF.

Examples of the material of the connector 16 include a thermosetting resin and a brazing material. Examples of a thermosetting resin used as the material of the connector 16 include a bisphenol A liquid epoxy resin. Examples of a brazing material used as the material of the connector 16 include solder, lead, and glass.

The connector 16 may be conductive. Examples of the connector 16 include silver epoxy, solder, an ACF, and an ACP. The connector 16 can electrically connect the flexible board 5 to the inorganic substrate 4. When, for example, the flexible board 5 and the inorganic substrate 4 are electrically connected at the same potential as the ground electrode, the inorganic substrate 4 can shield the electronic device 10 from external noise.

In the example shown in FIGS. 9A and 9B, the outer periphery of the flexible board 5 is partially aligned with the outer periphery of the frame 2 as viewed from above. When the outer periphery of the flexible board 5 is partially aligned with or located inward from the outer periphery of the frame 2, the profile of the electronic package 21 can be adjusted precisely in conformance with the outer periphery of the inorganic substrate 4. This structure can thus further downsize the electronic package 21, and easily allow uniform external dimensions of the electronic package 21. As in the example shown in FIGS. 9A and 9B, the cavities 16a in the connector 16 may be formed with the same method as used for the cavities 15a in the bond 15.

The present invention is not limited to the examples described in the above embodiments. All the embodiments according to the present invention may be variously modified, including numerical values. For example, although the pads 3 are rectangular in the example in FIGS. 1A to 9B, they may be circular or polygonal other than rectangular. In the present embodiment, any number of pads 3 with any shapes may be in any arrangement. The characteristic features according to the embodiments may be variously combined, without being limited to the examples described in the above embodiments.

REFERENCE SIGNS LIST 1 electronic device mounting board
2 frame
3 pad (for connection to electronic device)
4 inorganic substrate
4a surrounding area
4b mount area
5 flexible board
10 electronic device
12 lid
13 connection member
14 adhesive member
15 bond
15a cavity
16 connector
16a another cavity
19 housing
21 electronic package
22 electronic component
31 electronic module

The invention claimed is:
1. An electronic device mounting board, comprising:
an inorganic substrate including, on an upper surface, a mount area on which an electronic device is mountable, and a surrounding area surrounding the mount area;
a frame located in the surrounding area of the inorganic substrate to surround the mount area; and
a bond located in the surrounding area between the inorganic substrate and the frame, the bond having a plurality of cavities.
2. The electronic device mounting board according to claim 1, wherein
the cavities in the bond face the inorganic substrate.
3. The electronic device mounting board according to claim 1, wherein
the cavities in the bond face the frame.
4. The electronic device mounting board according to claim 1, wherein as viewed from above, the frame has an outer periphery overlapping an outer periphery of the inorganic substrate, and an inner periphery overlapping an outer periphery of the mount area, the mount area is decentered from a center of the inorganic substrate, and as viewed from above, the bond has more cavities in a wide part of the surrounding area than in a narrow part of the surrounding area.

5. The electronic device mounting board according to claim 1, further comprising:

a frame-shaped flexible board located between the upper surface of the inorganic substrate and a lower surface of the frame to surround the mount area.

6. The electronic device mounting board according to claim 1, wherein the inorganic substrate comprises a metal material.

7. The electronic device mounting board according to claim 1, wherein the cavities have a lower thermal conductivity than the bond.

8. An electronic package, comprising:

the electronic device mounting board according to claim 1;

the electronic device mounted on the mount area of the inorganic substrate of the electronic device mounting board; and a lid located at an upper end of the frame of the electronic device mounting board to cover an area surrounded by the frame.

* * * * *